(12) United States Patent
Shou

(10) Patent No.: US 9,337,792 B1
(45) Date of Patent: May 10, 2016

(54) TRIMMING GAIN AND CMMR IN DIFFERENCE AMPLIFIER

(71) Applicant: LINEAR TECHNOLOGY CORPORATION, Milpitas, CA (US)

(72) Inventor: Xiaoqiang Shou, Westford, MA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 0 days.

(21) Appl. No.: 14/335,696

(22) Filed: Jul. 18, 2014

(51) Int. Cl.
*H03F 3/45* (2006.01)
*H03G 3/00* (2006.01)

(52) U.S. Cl.
CPC ............ *H03G 3/004* (2013.01); *H03F 3/45071* (2013.01); *H03F 2003/45008* (2013.01); *H03F 2203/45528* (2013.01)

(58) Field of Classification Search
USPC .................................................. 330/252–261
See application file for complete search history.

(56) References Cited

U.S. PATENT DOCUMENTS 6,538,507 B2 * 3/2003 Prentice et al. ................. 330/85

* cited by examiner

*Primary Examiner* — Hieu Nguyen
(74) *Attorney, Agent, or Firm* — McDermott Will & Emery LLP

(57) ABSTRACT

A multistage amplifier may include a multistage amplifier circuit and a resistive voltage divider network. The multistage amplifier circuit may have multiple transconductance input stages, each of which may have differential inputs and an adjustable tail current input that controls the amount of the transconductance of the input stage. The resistive voltage divider network may control the closed loop gain of the multistage amplifier circuit and include multiple resistors that provide different voltage divider ratios at different points. Each point may be connected to one of the transconductance input stages. Adjustment of tail currents at the tail current inputs may control the degree to which each point affects the closed loop gain of the multistage amplifier.

20 Claims, 6 Drawing Sheets

TRIMMING GAIN AND CMMR IN DIFFERENCE AMPLIFIER

BACKGROUND

1. Technical Field

This disclosure relates to trimming the gain in amplifiers, including difference amplifiers, and trimming the common mode rejection ratio (CMMR) in difference amplifiers.

2. Description of Related Art

In high precision difference amplifiers, instrumentation amplifiers, and programmable gain amplifiers, gain accuracy and common mode rejection ratio (CMRR) may be limited by mismatched resistors.

SiCr resistors may be used in such circuits due to their low temp coefficients and matching properties. However, these resistors may still have mismatches between hundreds and a thousand parts per million (ppm). It may be necessary to trim these resistors to achieve only 100 ppm gain error and greater than 100 dB CMRR. However, further reducing the mismatch may require a large layout area that may be undesirable.

Laser trimming of SiCr resistors or metal link may be carried out during wafer sort. Unfortunately, laser trimming SiCr resistors may not be feasible in processes that have a planarized backend. Laser trimming can also be slow and devices under test (DUT) may still be subject to post package shift. Wafer sorting of 100 dB CMRR may also degrade to 86 dB post package due to stress. Laser trimming SiCr resistors may also not account for a temperature coefficient in both gain and CMRR. Metal link, on the other hand, may have reliability issues in addition to the above problems.

Trimming may also be performed post-package using digital switching.

However, this approach may require a dramatic increase in the complexity of the circuit, particular when the difference amplifier operates at a high voltage. These switches could also see a large signal swing that may require robust protection. An undesirable temperature coefficient in gain and CMRR may also remain. The switches may also increase input noise, leakage current, and make frequency compensation more difficult.

SUMMARY

A multistage amplifier may include a multistage amplifier circuit and a resistive voltage divider network. The multistage amplifier circuit may have multiple transconductance input stages, each of which may have differential inputs and an adjustable tail current input that controls the amount of the transconductance of the input stage. Two outputs of all of the input transconductance stages may be shorted with the same polarity and may drive a second stage of the amplifier. The resistive voltage divider network may control the closed loop gain of the multistage amplifier circuit and include multiple resistors that provide different voltage divider ratios at different points. Each point may be connected to one of the transconductance input stages. Adjustment of tail currents at the tail current inputs may control the degree to which each point affects the closed loop gain of the multistage amplifier.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Figure 1:
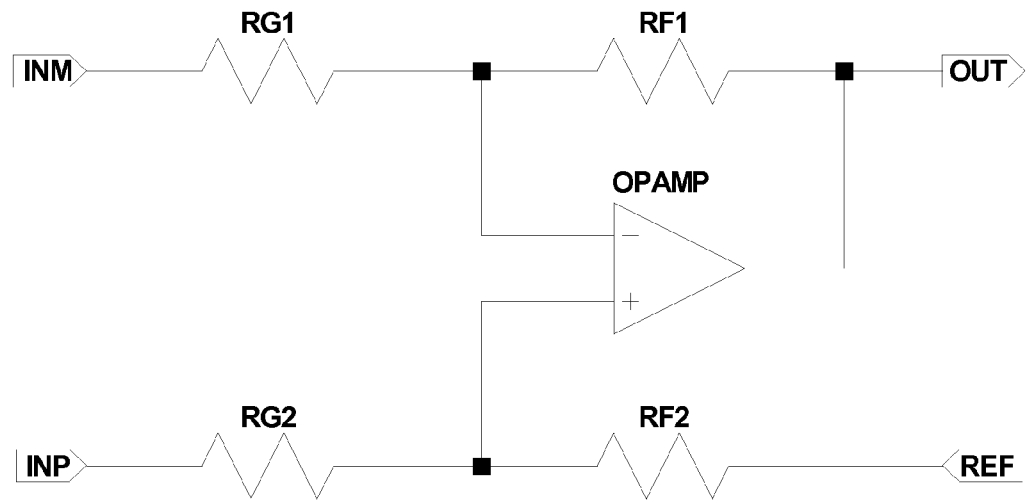
FIG. 1 illustrates an example of a prior art difference amplifier.

FIG. 1 illustrates an example of a prior art difference amplifier. As indicated above, its gain accuracy and common mode rejection ratio (CMRR) may be limited by a mismatch in resistors, such as a mismatch between RG1 and RG2 and/or a mismatch between RF1 and RF2, as well as ratio difference between gain target and RF1/RG1 and RF2/RG2.

As also indicated above, this mismatch may be aided by using SiCr resistors or laser trimming. But each of these approaches may also be problematic, as also explained above in more detail.

Figure 2:
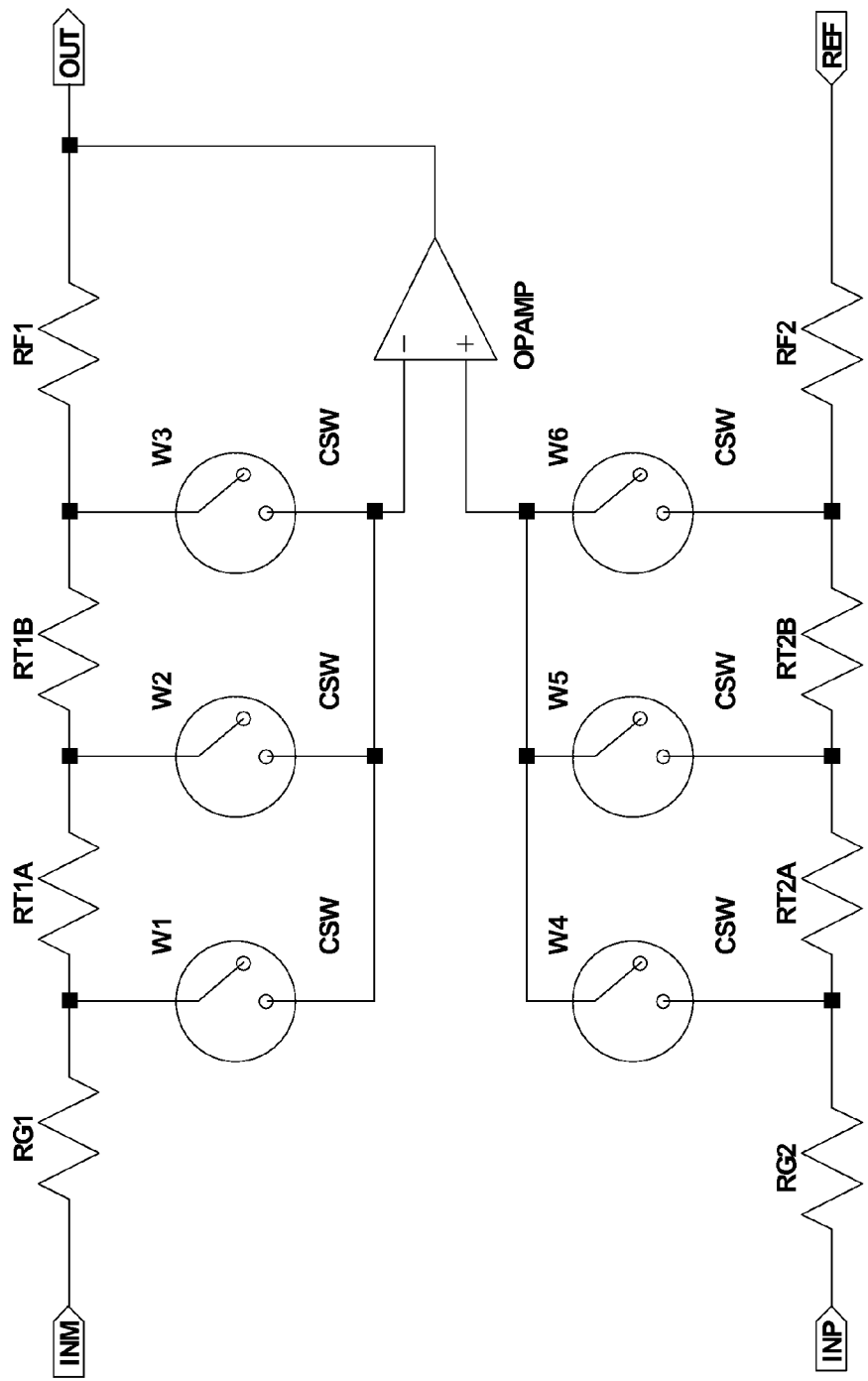
FIG. 2 illustrates an example of a prior art difference amplifier that uses post-packaging switches to match resistors.

FIG. 2 illustrates an example of a prior art difference amplifier that uses post-packaging switches to match resistors. But this approach may also be problematic, as also explained above in more detail.

Figure 3:
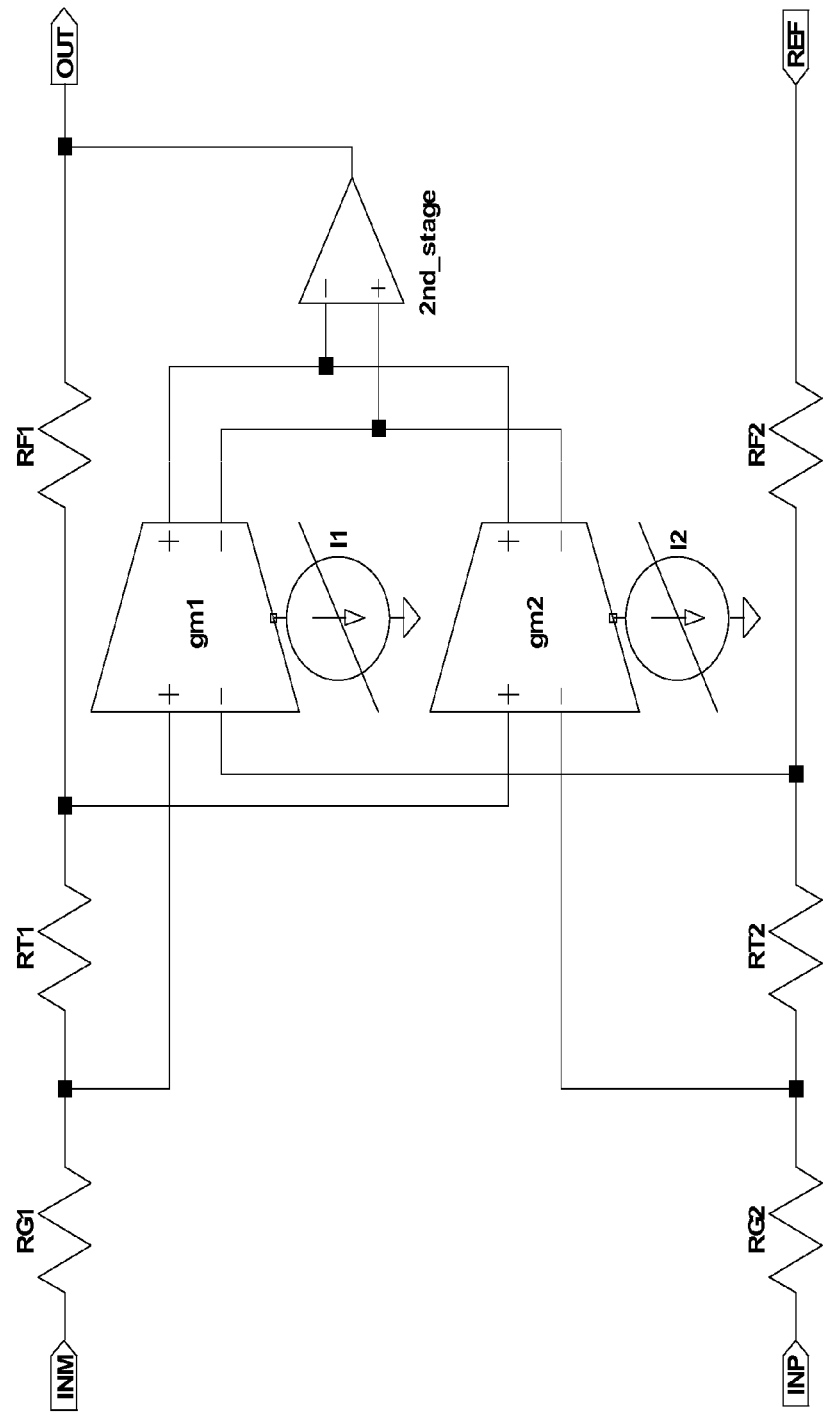
FIG. 3 illustrates an example of a different approach to compensating for mismatched resistors in a difference amplifier after packaging that uses multiple transconductance input stages and an associated resistive voltage divider network.

FIG. 3 illustrates an example of an approach to compensating for mismatched resistors in a difference amplifier after packaging that uses multiple transconductance input stages and an associated resistive voltage divider network. In this circuit, the tail currents of input differential transconductance input stages gm1 and gm2 may be adjusted. In turn, this may adjust the total transconductance gm contribution from each differential pair gm1 and gm2 to achieve a desired gain and CMRR.

For example, when I1=0, only I2 may keep gm2 on. The new equivalent resistors RG1', RF1', RG2', RF2', may become:

$$RG1'=RG1+RT1$$

$$RF1'=RF1$$

$$RG2'=RG2$$

$$RF2'=RT2+RF2$$

Since the mismatch between RG and RF may be very small, e.g. 500 ppm, it's expected that RT may also be very small, such as between 10 and 1000 ppm.

If gm1 and gm2 are viewed together as a composite input differential pair, the inputs of this composite pair may be slid along RT1 and RT2 by adjusting I1 and I2. Adjusting I1 and I2 and thus the transconductance of gm1 and gm2, respectively, may simultaneously affect both the gain of the difference amplifier and its common mode rejection ratio.

When the input stage to the differential pair gm1 and gm2 uses bi-polar transistors (BJTs), it may be best to cause the sum of I1 and I2 to always be equal to a constant to keep the total gm constant over the trim range, thus avoiding degradation in stability.

Figure 4:
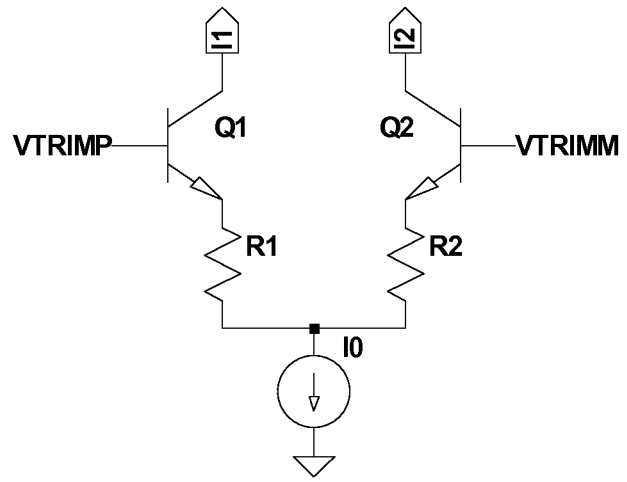
FIG. 4 illustrates an example of a circuit that may be used to generate an adjustable I1 and I2 for input stages that are BJT, which always sum to a constant in response to an adjustable differential input voltage VTrimP and VTrimM.

FIG. 4 illustrates an example of a circuit that may be used to generate an adjustable I1 and I2 that always sum to a constant in response to an adjustable differential input voltage VTrimP and VTrimM.

When the input stages to gm1 and gm2 are MOSFET, it may be best to cause the sum of the square root of I1 and the square root of I2 to always be equal to a constant, again to keep the total gm constant over the trim range, thus avoiding degradation in stability.

Figure 5:
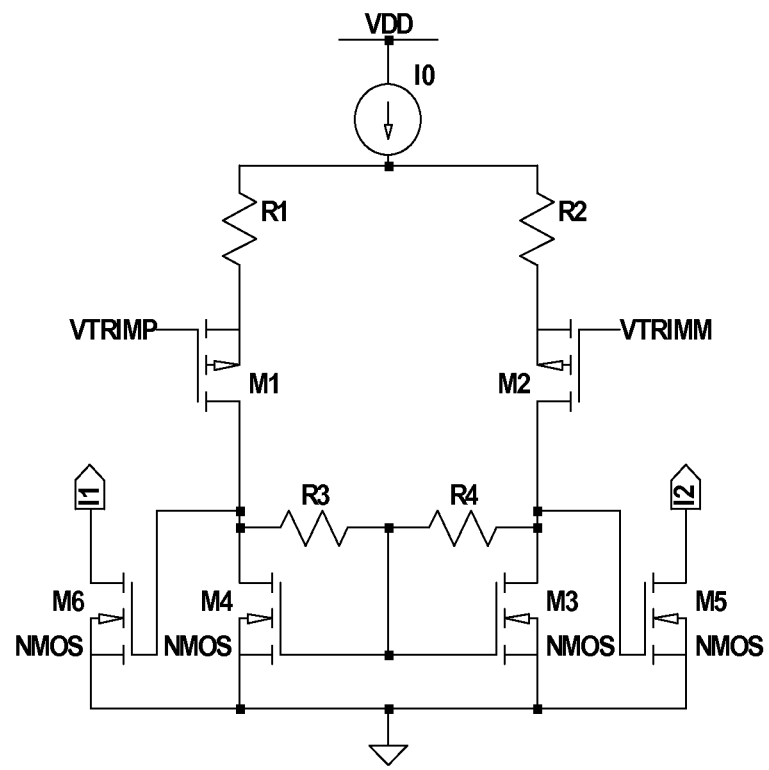
FIG. 5 illustrates an example of a circuit that may be used to generate an adjustable I1 and I2 for input stages that are MOSFET, the square roots of which always sum to a constant in response to an adjustable differential input voltage VTrimP and VTrimM.

FIG. 5 illustrates an example of a circuit that may be used to generate an adjustable I1 and I2 for input stages that are MOSFET, the square roots of which always sum to a constant in response to an adjustable differential input voltage VTrimP and VTrimM.

VTrimP and VTrimM may thus control I1 and I2 and, in turn, gm1 and gm2, similar to an analog multiplier. By turning-on one gm more than the other, this can effectively cause different resistor divider ratios and thus adjust for gain error and CMRR.

A temperature coefficient in VTrimP and VTrimM may be preprogramed to account for a temperature coefficient in gain error and CMRR.

Figure 6:
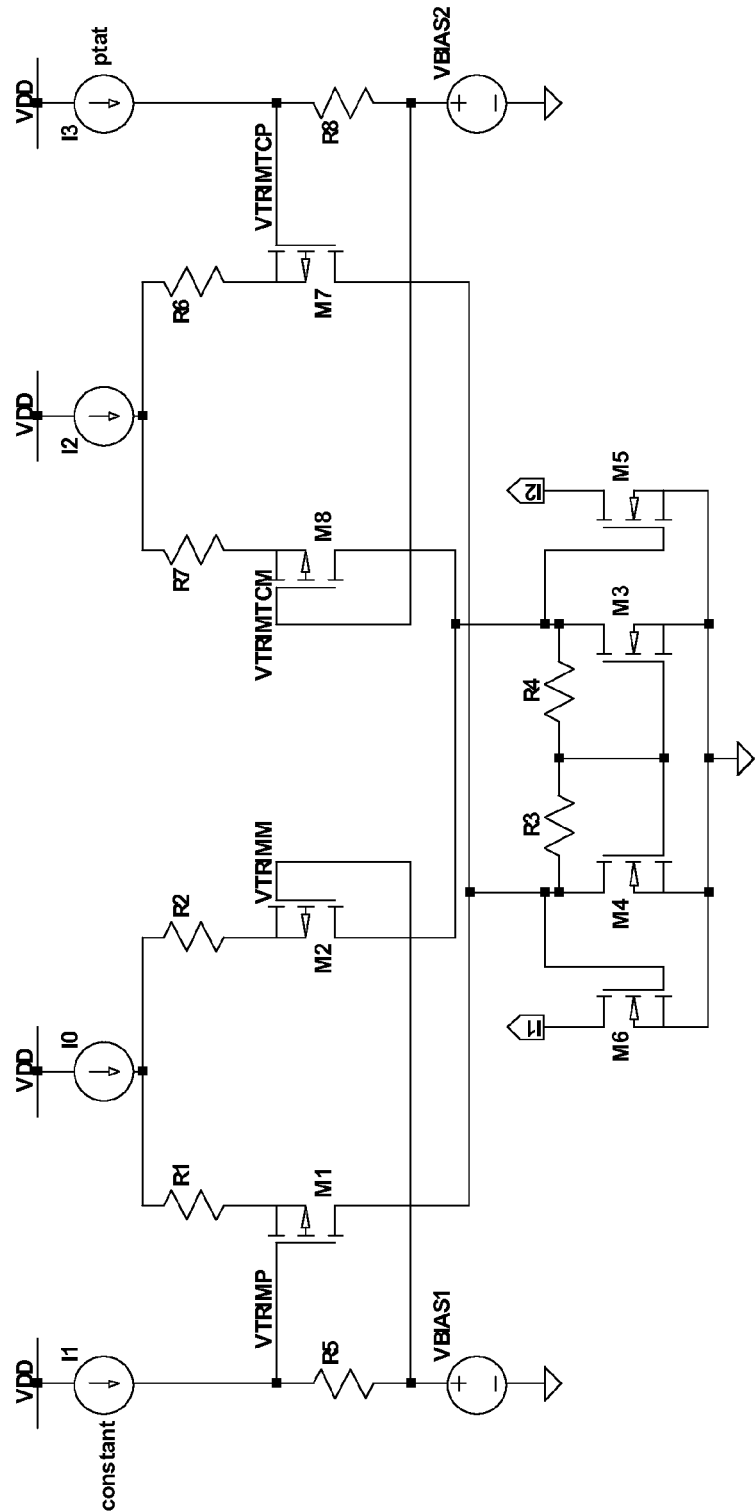
FIG. 6 illustrates an example of a circuit that may be used to generate the desired I1 and I2 for MOSFET input stages that includes temperature compensation.

FIG. 6 illustrates an example of a circuit that may be used to generate the desired I1 and I2 for MOSFET input stages that includes temperature compensation. The upper left portion of this circuit may generate temperature-independent values for a temperature-independent portion of VTrimP and VTrimM using a temperature independent current source I1. The upper right portion of this circuit may generate temperature-dependent values for a temperature-dependent portion of VTrimP and VTrimM using a proportional to absolute temperature (PTAT) current source I3. R5 may be trimmed, such as by using fuses, to control the difference between VTrimP and VTrimM. This temperature compensation may cause the closed loop gain of the multistage amplifier to remain constant, notwithstanding changes in temperature. A comparable circuit may be used for BJT input stages.

Gm1 and gm2 may each see a much larger input differential signal given the same output swing, compared to a single input differential pair. This may cause an increase in distortion. The larger the trim range, the less linear the input composite pair may be, and the higher the output distortion. For well-matched SiCr resistors with a mismatch below 1000 ppm, however, such distortion rise may be insignificant.

The new trimming schemes that have now been described may provide one or more of the following benefits:

1. Post package trim, including package introduced shift.
2. Fast trim.
3. All circuits may be made of low voltage devices and may operate close to either rail. Its robustness may be superior in high voltage applications. Layout size may be small.
4. There may be almost no noise or Vos penalty.
5. Continuous operation may be possible, along with the ability to trim for a temperature coefficient in gain error and CMRR.
6. May take full advantage of the small trim range such that a distortion penalty is tolerable. In particular, for a low voltage design, the distortion can be well below 120 dBc at DC when the trim range is up to 1000 ppm.
7. The analog multiplier concept may be used on multiple input differential pairs and can be easily extended to any resistor ratio feedback application.

Figure 7:
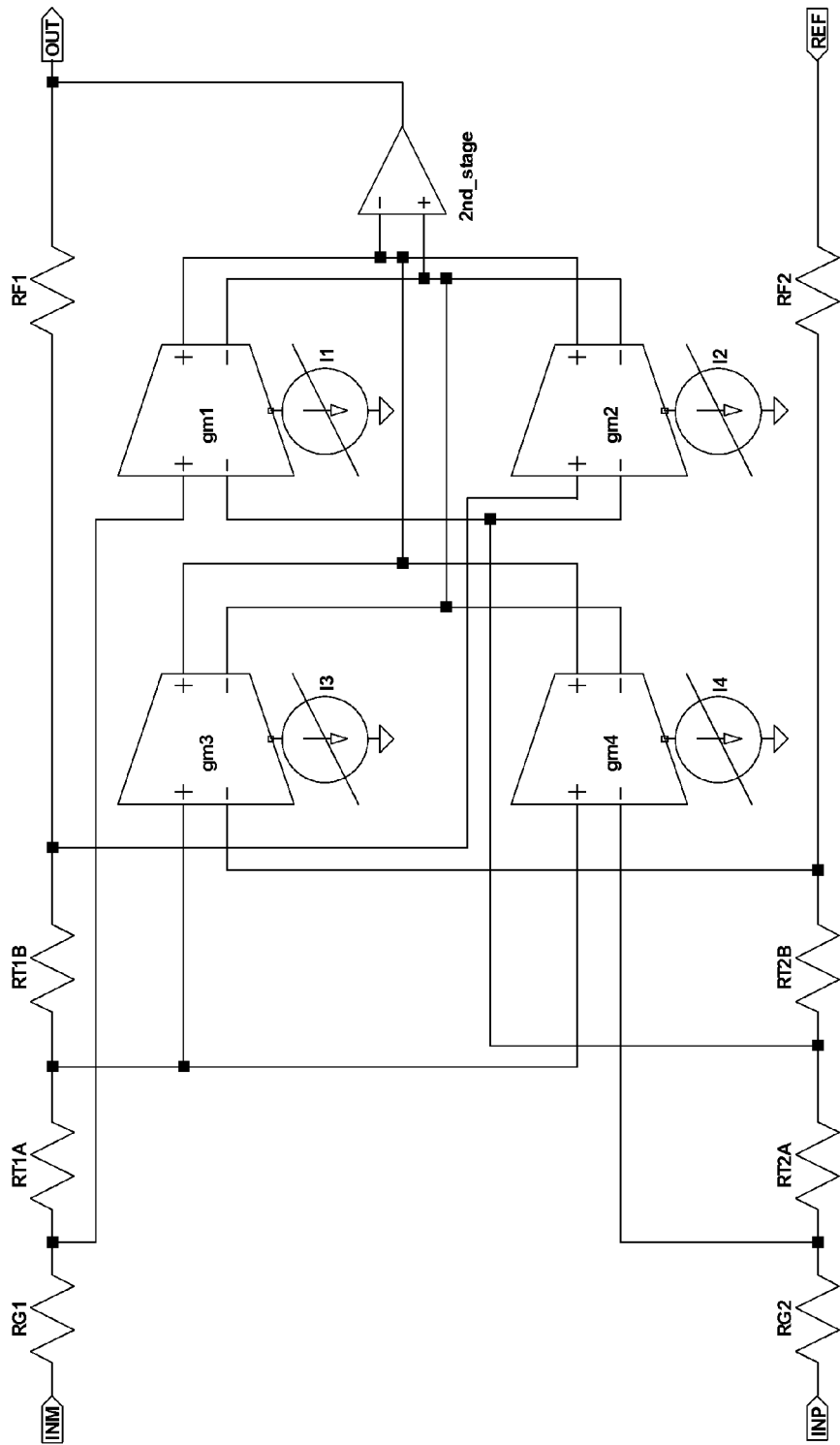
FIG. 7 illustrates another example of a circuit for compensating for mismatched resistors in a difference amplifier after packaging that uses multiple transconductance input stages and an associated resistive voltage divider network.

FIG. 7 illustrates another example of a circuit for compensating for mismatched resistors in a difference amplifier after packaging that uses multiple transconductance input stages and an associated resistive voltage divider network. In this circuit, the trimming of gain and CMRR trim are decoupled. Specifically, gain may be trimmed by adjusting I1 and I2, while CMRR may be trimmed by adjusting by I3 and I4.

As also illustrated in FIG. 7, six different tap points may be used in the trimming (as contrasted to the four illustrated in FIG. 3). In a still further embodiment, eight tap points might be used.

Figure 8:
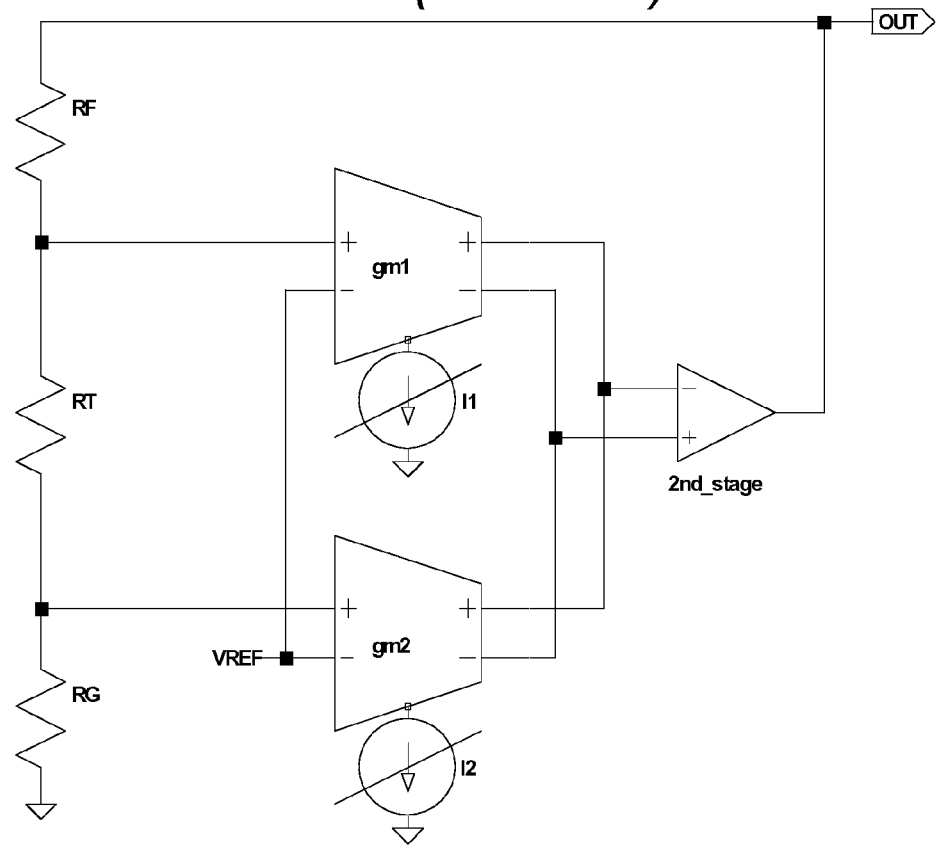
FIG. 8 illustrates an example of a circuit for compensating for mismatched resistors in a single-ended amplifier after packaging that uses multiple transconductance input stages and an associated resistive voltage divider network.

FIG. 8 illustrates an example of a circuit for compensating for mismatched resistors in a single-ended amplifier after packaging that uses multiple transconductance input stages and an associated resistive voltage divider network. This circuit may similarly provide for post package trim for gain error (Vout) due to resistor mismatch over temperature.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and advantages. These also include embodiments in which the components and/or steps are arranged and/or ordered differently.

For example, a combination of digital switch as in FIG. 2 and the new tail current control trimming scheme may further improve trimming range; new topology following the circuit in FIG. 7 with more than six tap points may increase trimming range; the new trimming scheme may be applied to amplifiers with a voltage divider made of material other than SiCr (for example, poly resistors); although the simplest topology of a voltage divider network may be resistors connected in series, it may be possible to have a combination of series and parallel resistors in a network to create the multiple tap points; the voltage divider may be implemented with a capacitor instead of resistor in some applications; the connection between tap points and the multiple input stages may be flexible and may be different from what is shown in FIG. 3 and FIG. 7, as long as the tail current control yields non-singular effect on gain and CMRR; the tail current generator circuit may use a differential pair with degeneration resistors to improve trimming linearity, many other linearization circuit techniques may be used to serve the same purpose; and although the constant current source and PTAT current source may be used to create a desirable temperature coefficient for the tail current control, other circuits may instead be used for the same purpose.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:
1. A multistage amplifier comprising:
a multistage amplifier circuit that has multiple transconductance input stages, each of which has differential inputs and an adjustable tail current input that controls the amount of the transconductance of the input stage;
a resistive voltage divider network that controls the closed loop gain of the multistage amplifier circuit and that comprises multiple resistors that provide different voltage divider ratios at different points, each point being connected to one of the transconductance input stages,
wherein adjustment of tail currents at the tail current inputs controls the degree to which each point affects the closed loop gain of the multistage amplifier, and
at least one of the following lettered limitations:
   A. an adjustable tail current generator circuit that generates the tail currents in an adjustable manner, wherein the sum of the transconductances of the input stages remains substantially the same, notwithstanding adjustments to the adjustable tail currents by the adjustable tail current generator circuit, and wherein the adjustable tail current generator circuit includes at least one differential pair of transistors; or
   B. wherein the multistage amplifier is a difference amplifier; wherein adjustment of the tail currents at the tail current inputs also simultaneously controls the common mode rejection ratio of the difference amplifier; wherein adjustment of the tail currents at the tail current inputs also controls the gain of the difference amplifier; wherein the differential inputs of each of the transconductance input stages are connected to each of the sets of three resistors; and the first set of resistors provides a feedback path in the difference amplifier; and one of the following parenthetically numbered limitations:
      (1) the second of the set of resistors provides a feed forward path in the difference amplifier; the first set of resistors has a first, second, and third resistor, the first resistor being connected at one end to a negative input of the difference amplifier and at the other end to one end of the second resistor, the other end of the second resistor being connected to one end of the third resistor, and the other end of the third resistor being connected to an output of the difference amplifier; the second set of resistors has a fourth, fifth, and sixth resistor, the fourth resistor being connected at one end to a positive input of the difference amplifier and at the other end to one end of the fifth resistor, the other end of the fifth resistor being connected to one end of the sixth resistor, and the other end of the sixth resistor being connected to a reference voltage; one of the differential inputs to a first of the transconductance input stages is connected to the junction between the first and the second resistors; the other differential input to the first of the transconductance input stages is connected to the junction between the fifth and the sixth resistors; one of the differential inputs to a second of the transconductance input stages is connected to the junction between the second and the third resistors; and the other differential input to the second of the transconductance input stages is connected to the junction between the fourth and the fifth resistors; or
      (2) the first set of resistors has a first, second, third, and fourth resistor, the first resistor being connected at one end to a negative input of the differ- ence amplifier and at the other end to one end of the second resistor, the other end of the second resistor being connected to one end of the third resistor, the other end of the third resistor being connected to one end of the fourth resistor, the other end of the fourth resistor being connected to an output of the difference amplifier; the second set of resistors has a fifth, sixth, seventh, and eighth resistor, the fifth resistor being connected at one end to a positive input of the difference amplifier and at the other end to one end of the sixth resistor, the other end of the sixth resistor being connected to one end of the seventh resistor, the other end of the seventh resistor being connected to one end of the eighth resistor, the other end of the eighth resistor being connected to a reference voltage; one of the differential inputs to a first of the transconductance input stages is connected to the junction between the first and the second resistors; the other differential input to the first of the transconductance input stages is connected to the junction between the sixth and the seventh resistors; one of the differential inputs to a second of the transconductance input stages is connected to the junction between the third and the fourth resistors; the other differential input to the second of the transconductance input stages is connected to the junction between the sixth and the seventh resistors; one of the differential inputs to a third of the transconductance input stages is connected to the junction between the second and the third resistors; the other differential input to the third of the transconductance input stages is connected to the junction between the seventh and eighth resistors; one of the differential inputs to a fourth of the transconductance input stages is connected to the junction between the second and the third resistors; and the other differential input to the fourth of the transconductance input stages is connected to the junction between the fifth and the sixth resistors; or C. the multistage amplifier is a single-ended input amplifier.

2. The multistage amplifier of claim 1 further comprising an adjustable tail current generator circuit that generates the tail currents in an adjustable manner.

3. The multistage amplifier of claim 2 wherein the sum of the transconductances of the input stages remains substantially the same, notwithstanding adjustments to the adjustable tail currents by the adjustable tail current generator circuit.

4. The multistage amplifier of claim 3 wherein the adjustable tail current generator circuit includes at least one differential pair of transistors.

5. The multistage amplifier of claim 4 wherein the adjustable tail current generator circuit generates a differential set of adjustable tail current outputs that vary in proportion to a differential set of voltage inputs.

6. The multistage amplifier of claim 5 wherein the adjustable tail current generator circuit includes a pair of degeneration resistors that enhances the linearity of the transconductance of the adjustable tail current generator circuit.

7. The multistage amplifier of claim 3 wherein:
the multiple transconductance input stages include bipolar transistors; and
the sum of the tail currents are substantially constant, notwithstanding adjustments to the adjustable tail currents by the adjustable tail current generator circuit.

8. The multistage amplifier of claim 3 wherein:
the multiple transconductance input stages include MOSFET transistors; and
the sum of the square root of each of the tail currents are substantially constant, notwithstanding adjustments to the adjustable tail currents by the adjustable tail current generator circuit.

9. The multistage amplifier of claim 2 wherein the adjustable tail current generator circuit includes temperature compensation that adjusts the tail currents as a function of temperature so as to cause the closed loop gain of the multistage amplifier to remain constant, notwithstanding changes in temperature.

10. The multistage amplifier of claim 1 wherein the multistage amplifier is a difference amplifier.

11. The multistage amplifier of claim 10 wherein adjustment of the tail currents at the tail current inputs controls the gain of the difference amplifier.

12. The multistage amplifier of claim 10 wherein adjustment of the tail currents at the tail current inputs also simultaneously controls the common mode rejection ratio of the difference amplifier.

13. The multistage amplifier of claim 12 wherein adjustment of the tail currents at the tail current inputs also controls the gain of the difference amplifier.

14. The multistage amplifier of claim 10 wherein:
adjustment of the tail currents at some of the tail current inputs controls the gain of the difference amplifier; and
adjustment of the tail currents at others of the tail current inputs controls the common mode rejection ratio of the difference amplifier.

15. The multistage amplifier of claim 13 wherein the resistive voltage divider network includes a first and a second set of at least three resistors in series.

16. The multistage amplifier of claim 15 wherein the differential inputs of each of the transconductance input stages are connected to each of the sets of three resistors.

17. The multistage amplifier of claim 16 wherein:
the first set of resistors provides a feedback path in the difference amplifier; and
the second of the set of resistors provides a feed forward path in the difference amplifier.

18. The multistage amplifier of claim 17 wherein:
the first set of resistors has a first, second, and third resistor, the first resistor being connected at one end to a negative input of the difference amplifier and at the other end to one end of the second resistor, the other end of the second resistor being connected to one end of the third resistor, and the other end of the third resistor being connected to an output of the difference amplifier;
the second set of resistors has a fourth, fifth, and sixth resistor, the fourth resistor being connected at one end to a positive input of the difference amplifier and at the other end to one end of the fifth resistor, the other end of the fifth resistor being connected to one end of the sixth resistor, and the other end of the sixth resistor being connected to a reference voltage;
one of the differential inputs to a first of the transconductance input stages is connected to the junction between the first and the second resistors;
the other differential input to the first of the transconductance input stages is connected to the junction between the fifth and the sixth resistors;
one of the differential inputs to a second of the transconductance input stages is connected to the junction between the second and the third resistors;

the other differential input to the second of the transconductance input stages is connected to the junction between the fourth and the fifth resistors.

19. The multistage amplifier of claim 17 wherein:

the first set of resistors has a first, second, third, and fourth resistor, the first resistor being connected at one end to a negative input of the difference amplifier and at the other end to one end of the second resistor, the other end of the second resistor being connected to one end of the third resistor, the other end of the third resistor being connected to one end of the fourth resistor, the other end of the fourth resistor being connected to an output of the difference amplifier;

the second set of resistors has a fifth, sixth, seventh, and eighth resistor, the fifth resistor being connected at one end to a positive input of the difference amplifier and at the other end to one end of the sixth resistor, the other end of the sixth resistor being connected to one end of the seventh resistor, the other end of the seventh resistor being connected to one end of the eighth resistor, the other end of the eighth resistor being connected to a reference voltage;

one of the differential inputs to a first of the transconductance input stages is connected to the junction between the first and the second resistors;

the other differential input to the first of the transconductance input stages is connected to the junction between the sixth and the seventh resistors;

one of the differential inputs to a second of the transconductance input stages is connected to the junction between the third and the fourth resistors;

the other differential input to the second of the transconductance input stages is connected to the junction between the sixth and the seventh resistors;

one of the differential inputs to a third of the transconductance input stages is connected to the junction between the second and the third resistors;

the other differential input to the third of the transconductance input stages is connected to the junction between the seventh and eighth resistors;

one of the differential inputs to a fourth of the transconductance input stages is connected to the junction between the second and the third resistors;

the other differential input to the fourth of the transconductance input stages is connected to the junction between the fifth and the sixth resistors.

20. The multistage amplifier of claim 1 wherein the multistage amplifier is a single-ended input amplifier.

* * * * *